(12) United States Patent
Levitt et al.

(10) Patent No.: US 7,318,205 B2
(45) Date of Patent: *Jan. 8, 2008

(54) MEASURE OF ANALYSIS PERFORMED IN PROPERTY CHECKING

(76) Inventors: Jeremy Rutledge Levitt, 1700 N. First St. #304, San Jose, CA (US) 95112; Christophe Gauthron, 562 Pettis Ave., Mountain View, CA (US) 94041; Chian-Min Richard Ho, 3128 Avalon Ct., Palo Alto, CA (US) 94306; Ping Fai Yeung, 1101 Brooks Range Landing, San Jose, CA (US) 95151; Kalyana C. Mulam, 3255 Montelena Dr., San Jose, CA (US) 95135; Ramesh Sathianathan, 1172F Le Rochelle Ter., Sunnyvale, CA (US) 94089

( * ) Notice: Subject to any disclaimer, the term of this patent is extended or adjusted under 35 U.S.C. 154(b) by 445 days.

This patent is subject to a terminal disclaimer.

(21) Appl. No.: 11/006,238

(22) Filed: Dec. 6, 2004

(65) Prior Publication Data

US 2005/0081169 A1 Apr. 14, 2005

Related U.S. Application Data

(63) Continuation of application No. 10/174,379, filed on Jun. 17, 2002, now Pat. No. 6,848,088.

(51) Int. Cl.
*G06F 17/50* (2006.01)
(52) U.S. Cl. ............................................. 716/4; 716/2
(58) Field of Classification Search ................ 716/2, 716/4, 5; 703/2, 22
See application file for complete search history.

(56) References Cited

U.S. PATENT DOCUMENTS

| 5,465,216 | A | 11/1995 | Rotem et al. ............... 364/488 |
| 5,724,504 | A | 3/1998 | Aharon et al. ......... 395/183.09 |
| 6,102,959 | A | 8/2000 | Hardin et al. .................. 703/2 |
| 6,192,505 | B1 | 2/2001 | Beer et al. ..................... 716/2 |

(Continued)

OTHER PUBLICATIONS

P.A. Abdulla, P. Bjesse, and N. Een. "Symbolic Reachability Analysis Based on SAT Solvers," TACAS '00, 6th International Conference on Tools and Algorithms for the Construction and Analysis of Systems (TACAS), Springer-Verlag, 2000, pp. 411-425.

(Continued)

*Primary Examiner*—Jack Chang
*Assistant Examiner*—Binh Tat
(74) *Attorney, Agent, or Firm*—Trellis Intellectual Property Law Group, PC

(57) ABSTRACT

The amount of analysis performed in determining the validity of a property of a digital circuit is measured concurrent with performance of the analysis, and provided as an output when a true/false answer cannot be provided e.g. when stopped due to resource constraints. In some embodiments, a measure of value N indicates that a given property that is being checked will not be violated within a distance N from an initial state from which the analysis started. Therefore, in such embodiments, a measure of value N indicates that the analysis has implicitly or explicitly covered every possible excursion of length N from the initial state, and formally proved that no counter-example is possible within this length N.

26 Claims, 5 Drawing Sheets

U.S. PATENT DOCUMENTS

| | | | |
|---|---|---|---|
| 6,292,765 B1 | 9/2001 | Ho et al. | 703/14 |
| 6,311,293 B1 | 10/2001 | Kurshan et al. | 714/37 |
| 6,356,858 B1 | 3/2002 | Malka et al. | 702/186 |
| 6,457,162 B1 * | 9/2002 | Stanion | 716/7 |
| 6,539,523 B1 * | 3/2003 | Narain et al. | 716/5 |
| 6,728,939 B2 * | 4/2004 | Johannsen | 716/5 |
| 6,848,088 B1 * | 1/2005 | Levitt et al. | 716/4 |
| 7,020,856 B2 * | 3/2006 | Singhal et al. | 716/4 |

OTHER PUBLICATIONS

A PhD thesis by K. L. McMillan entitled "Symbolic model checking—an approach to the state explosion problem", Carnegie Mellon University, 1992, pp. 1-212.

E. M. Clarke, E. A. Emerson and A. P. Sistla entitled "Automatic verification of finite-state concurrent systems using temporal logic specifications" published in ACM Transactions on Programming Languages and Systems, 8(2):244-263, 1986.

Hoskote, Y. V., et al., "Automatic Extraction of the Control Flow Machine and Application to Evaluating Coverage of Verification Vectors", International Conference on Computer Design: VLSI in Computers & Processors, Oct. 2-4, 1995, pp. 532-537.

Martin Davis, George Longemann, and Donald Loveland, "A machine program for theorem-proving" in Communications of the ACM, 5(7):394-397, Jul. 1962.

C. Maxfield, EEdesign, "Why properties are important", May 12, 2002 (10:20AM), URL: http://www.eedesign.com/story/OEG20020515S0033, pp. 1-5.

R. Goering & M. Santarini, EE Times, "Tool vendors attach verification logjam", Mar. 4, 2002 (7:29 AM), URL: http://www.eedesign.com/story/OEG20020304S0018, pp. 1-4.

A. Biere, A. Cimatti, E.M. Clarke, and Y. Zhu, "Symbolic Model Checking Using SAT Procedures Instead of BDDs," Proceedings of the Design Automation Conference (DAC '99), Jun. 1999.

A. Biere, A. Cimatti, E.M. Clarke, and Y. Zhu, "Symbolic Model Checking without BDDs," Proceedings of Workshop on Tools and Algorithms for the Construction and Analysis of Systems (TACAS), vol. 1579, LNCS, 1999.

J. R. Burch, E. M. Clarke, K. L. McMillan, D. L. Dill, and J. Hwang, "Symbolic model checking: 10²⁰ states and beyond", published in Information and Computation, vol. 98, No. 2, Jun. 1992.

Yatin Hoskote, Timothy Kam, Pei-Hsin Ho, and Xudong Zhao, "Coverage Estimation for Symbolic Model Checking", published in Proceedings of DAC 1999 (Best Paper Award), pp. 300-305.

Jerry R. Burch and David L. Dill, "Automatic Verification of Pipelined Microprocessor Control", published in the proceedings of International Conference on Computer-Aided Verification, LNCS 818, Springer-Verlag, Jun. 1994, pp. 1-17.

David Dill, Andreas Drexler, Alan Hu and C. Han Yang, "Protocol Verification as a Hardware Design Aid" published in Proceedings of the International Conference on Computer Design, Oct. 1992, pp. 1-4.

Moundanos, D., "Abstraction Techniques for Validation Coverage Analysis and Test Generation", Believed to be prior to Jun. 2002, pp. 1-35.

Devadas, S., et al., "An Observability-Based Code Coverage Metric for Functional Simulation", IEEE/ACM International Conference on Computer-Aided Design, Nov. 10-14, 1996, pp. 418-425.

Geist, D., et al., "Coverage-Directed Test Generation Using Symbolic Techniques", Formal Methods in Computer-Aided Design, First International Conf., FMCAD 96, Palo Alto, CA, Nov. 6-8, 1996, pp. 142-159.

M.W. Moskewicz, C.F. Madigan, Y. Zhao, L. Zhang, and S. Malik, "Chaff: Engineering an Efficient SAT Solver", in 38th Design Automation Conference (DAC '01), Jun. 2001, pp. 530-535.

A. Kuehlmann, M. Ganai & V. Paruthi, "Circuit-Based Boolean Reasoning", Proceedings of the Design Automation Conference (DAC'01), Jun. 2001, 8 pages.

A. Kuehlmann, V. Paruthi, F. Krohm, & M. Ganai, Robust Boolean Reasoning for Computer-Aided Design of Integrated Circuits and Systems, vol. 21, No. 12, Dec. 2002, pp. 1377-1394.

M. Ganai, & A. Aziz, "Improved SAT-Based Bounded Reachability Analysis", Proceedings of the 15th International Conference on VLSI Design (VLSID '02), Mar. 2002, 6 pages.

E. Clarke, A. Biere, R. Raimi & Y. Zhu, "Bounded Model Checking Using Satisfiability Solving", Formal Methods in System Design vol. 19 Issue I, Jul. 2001, by Kluwer Academic Publishers, pp. 1-20.

C. Kern & M. Greenstreet, "Formal Verification in Hardware Design: A Survey", ACM Trans. On Design Automation of Electronic Systems, vol. 4, pp. 1-61, Apr. 1999, available on the Internet at http://citeseer.nj.nec.com/kern99formal.html.

R. C. Ho, C. Han Yang, M. A. Horowitz & D. L. Dill, "Architecture Validation for Processors", Proceedings 22nd Annual International Symposium on Computer Architecture, pp. 404-413, Jun. 1995.

R. C. Ho, & M. A. Horowitz, "Validation Coverage Analysis for Complex Digital Designs", Proceedings 1996 IEEE/ACM International Conference on Computer-Aided Design, pp. 146-151, Nov. 1996.

J. Gu, P.W. Purdom, J. Franco & B.W. Wah, "Algortihms for the Satisfiability (SAT) Problem: A Survey", DIAMACA Series on Discrete Mathematics and Theoretical Computer Science 35: 0-131, American Mathematical Society, 1997, available on the Internet at http://Citeseer.nj.nec.com/56722.html.

* cited by examiner

MEASURE OF ANALYSIS PERFORMED IN PROPERTY CHECKING

CROSS-REFERENCE TO PRIORITY APPLICATION

This application is a continuation of U.S. patent application Ser. No. 10/174,379 filed Jun. 17, 2002 now U.S. Pat. No. 6,848,088 which is incorporated by reference herein in its entirety.

BACKGROUND OF THE INVENTION

Exhaustively checking one or more properties in each and every possible state (e.g. of size 1000 bits) and each and every possible input combination to each state by simulation, (e.g. using test vectors) is prohibitively expensive. For this reason, digital circuits (portions thereof or in their entirety) are often analyzed by formal verification, to determine the validity of one or more properties that describe correct and incorrect behaviors in the circuit.

Formal verification of properties can use any of a variety of methods to prove that it is impossible to violate a given property, starting from an initial state or set of initial states of the digital circuit. Tools for formal verification of properties that are available in the prior art (either commercially or from public sources such as universities and laboratories) may be based on any of a number of techniques, such as (1) symbolic model checking, (2) symbolic simulation, (3) explicit state enumeration, and (4) satisfiability (SAT). For background on each of the just-described techniques, see, for example, the following references, each of which is incorporated by reference herein in its entirety:

(1) an article by J. R. Burch, E. M. Clarke, K. L. McMillan, D. L. Dill, and J. Hwang, entitled "Symbolic model checking: $10^{20}$ states and beyond", published in Information and Computation, Vol. 98, no. 2, June 1992; another article entitled "Coverage Estimation for Symbolic Model Checking" by Yatin Hoskote, Timothy Kam, Pei-Hsin Ho, and Xudong Zhao, published in Proceedings of DAC 1999 (Best Paper Award), pp. 300-305, and a PhD thesis by K. L. McMillan entitled "Symbolic model checking—an approach to the state explosion problem", Carnegie Mellon University, 1992;

(2) article entitled "Automatic Verification of Pipelined Microprocessor Control," by Jerry R. Burch and David L. Dill, published in the proceedings of International Conference on Computer-Aided Verification, LNCS 818, Springer-Verlag, June 1994;

(3) article by E. M. Clarke, E. A. Emerson and A. P. Sistla entitled "Automatic verification of finite-state concurrent systems using temporal logic specifications" published in ACM Transactions on Programming Languages and Systems, 8(2):244-263, 1986; and article entitled "Protocol Verification as a Hardware Design Aid" by David Dill, Andreas Drexler, Alan Hu and C. Han Yang published in Proceedings of the International Conference on Computer Design, October 1992.

(4) article entitled "Bounded Model Checking Using Satisfiability Solving" by Edmund Clarke, Armin Biere, Richard Raimi, and Yunshan Zhu, published in Formal Methods in System Design, volume 19 issue 1, July 2001, by Kluwer Academic Publishers.

In addition, see U.S. Pat. No. 5,465,216 granted to Rotem, et al. on Nov. 7, 1995, and entitled "Automatic Design Verification" (that is incorporated by reference herein in its entirety) for an additional example of formal verification tool. See also U.S. Pat. No. 6,192,505 granted to Beer, et al. on Feb. 20, 2001, and entitled "Method and system for reducing state space variables prior to symbolic model checking" that is incorporated by reference herein in its entirety.

Formal verification tools available in the prior art for property checking include, for example, Symbolic Model Verification (SMV) software package available from Carnegie-Mellon University, the coordinated specification analysis (COSPAN) software package available from Bell Laboratories (e.g. at ftp.research.att.com), and the VIS package available from University of California, Berkeley.

For additional information on formal verification tools, see C. Kern and M. R. Greenstreet, "Formal Verification in Hardware Design: A Survey," in ACM Trans. on Design Automation of Electronic Systems, vol. 4, pp. 123-193, April 1999 that is incorporated by reference herein in its entirety.

Such formal verification tools normally operate on a description of the digital circuit (also called "circuit-under-verification"), which is generated from a hardware description language (HDL) such as Verilog (see "The Verilog Hardware Description Language," Third Edition, Don E. Thomas and Philip R. Moorby, Kluwer Academic Publishers, 1996) or VHDL (see "A Guide to VHDL", Stanley Mazor and Patricia Langstraat, Kluwer Academic Publishers, 1992).

Therefore, during prior art testing of a digital circuit, properties or assertions about the correct and incorrect behaviors of the circuit may be checked using a formal verification tool. The properties are normally described using a HDL language such as Verilog or using a property specification language such as Sugar (e.g. available from IBM Research Labs, Haifa, Israel). To validate the correctness of a digital circuit, the formal verification tool must check many properties. The properties may be checked individually sequentially or combined simultaneously. The formal verification tool may start from a single initial state or from a set of initial states for each property.

One method for formal verification of properties is based on so-called bounded model checking (BMC). Such a method may use a Boolean formula that is TRUE if and only if the underlying state transition system can realize a sequence of state transitions that reaches certain states of interest within a fixed number of transitions. If such a sequence cannot be found at a given length, k, the search is continued for larger k. The procedure is symbolic, i.e., symbolic Boolean variables are utilized; thus, when a check is done for a specific sequence of length k, all sequences of length k from an initial plate are examined. A Boolean formula that is formed for each sequence is used by the tool, and if a satisfying assignment is found, that assignment is a "witness" (also called "counter example") for the sequence of interest.

Such a formal verification tool has three possible results for each Boolean formula: the formula is proven true; a counter-example is produced; or the tool cannot determine the truth of the Boolean formula because memory or compute resource limits prevent completion of the checking. The last-described result (i.e. "cannot determine") is often the case when such a tool is applied to a real-world digital circuit (such as a microprocessor) that has a large number of transistors (in the order of 1-5 million), because of the well known "state explosion problem"

As described in "Architecture Validation for Processors", by Richard C. Ho, C. Han Yang, Mark A. Horowitz and David L. Dill, Proceedings 22.nd Annual International Symposium on Computer Architecture, pp. 404-413, June 1995, "modern high-performance microprocessors are extremely complex machines which require substantial validation effort to ensure functional correctness prior to tapeout" (see page 404). As further described in "Validation Coverage Analysis for Complex Digital Designs" by Richard C. Ho and Mark A. Horowitz, Proceedings 1996 IEEE/ACM International Conference on Computer-Aided Design, pp. 146-151, November 1996, "the functional validation of state-of-the-art digital design is usually performed by simulation of a register-transfer-level model" (see page 146).

A number of metrics for verification tools are described in the prior art, for example, see the following articles:

(1) Hoskote, Y. V., et al., "Automatic Extraction of the Control Flow Machine and Application to Evaluating Coverage of Verification Vectors", International Conference on Computer Design: VLSI in Computers & Processors, Oct. 2-4, 1995, pp. 532-537;

(2) Moundanos, D., "Abstraction Techniques for Validation Coverage Analysis and Test Generation", IEEE Transactions on Computers, vol. 47, January 1998, pp. 2-14;

(3) Devadas, S., et al., "An Observability-Based Code Coverage Metric for Functional Simulation", IEEE/ACM International Conference on Computer-Aided Design, Nov. 10-14, 1996, pp. 418-425; and (4) Geist, D., et al., "Coverage-Directed Test Generation Using Symbolic Techniques", Formal Methods in Computer-Aided Design, First International Conference, FMCAD 96, Palo Alto, Calif., Nov. 6-8, 1996, pp. 142-159.

Each of the above-referenced articles (1)-(4) is incorporated by reference herein in its entirety.

See U.S. Pat. No. 6,102,959 granted to Hardin, et al. on Aug. 15, 2000 and entitled "Verification tool computation reduction" that is incorporated by reference herein in its entirety.

U.S. Pat. No. 6,311,293 granted to Kurshan, et al. on Oct. 30, 2001 and entitled "Detecting of model errors through simplification of model via state reachability analysis" that is incorporated by reference herein in its entirety.

Also incorporated by reference herein in their entirety are the following: U.S. Pat. No. 6,356,858 granted to Malka, et al. on Mar. 12, 2002 and entitled "Coverage measurement tool for user defined coverage models"; U.S. Pat. No. 5,724,504 granted to Aharon, et al. on Mar. 3, 1998 and entitled "Method for measuring architectural test coverage for design verification and building conformal test".

Also incorporated by reference herein in their entirety are the following references:

"Algorithms for the Satisfiability (SAT) problem: A Survey" by Jun Gu, Paul W. Purdom, John Franco, and Benjamin W. Wah, DIMACS Series on Discrete Mathematics and Theoretical Computer Science 35:19-151, American Mathematical Society, 1997;

"A machine program for therorem-proving" by Martin Davis, George Longemann, and Donald Loveland in Communications of the ACM, 5(7):394-497, July 1962; and "Chaff: Engineering an Efficient SAT Solver" by M. W. Moskewicz, C. F. Madigan, Y. Zhao, L. Zhang, and S. Malik, in 38th Design Automation Conference (DAC '01), June 2001, pp. 530-535.

SUMMARY

A computer is programmed in accordance with the invention, to use a formal verification tool to check for a counter-example of a property in a high level description (HLD) of a digital circuit, and concurrent with use of the tool, to maintain a measure of the analysis being performed by the tool. In certain embodiments, a measure of analysis performed without finding a counter-example, is reported to the user when the tool stops due to a limit on one or more resources, and without producing a proof or finding a counter-example.

Such an analysis measure may be used as a guide for future testing, or to terminate testing. In some embodiments, a value N for the analysis measure indicates that a given property will not be violated within N sequential transitions through a number of states reachable from a user-specified initial state. Therefore, in such embodiments, the measure (also called "proof radius") of value N indicates that the formal verification tool has exhaustively covered every possible excursion of length N from the initial state, and formally proved that no error is possible.

DETAILED DESCRIPTION

In accordance with the invention, a formal verification tool is used to iteratively check that a property (such as a Boolean formula)is satisfied by all states that are within a certain number of transitions (e.g. 1 transition)starting from an initial state (which may be, for example, specified by the user). For example, as illustrated in FIG. 1, a method 100 uses the tool in act 101 to perform one iteration, and checks if a resource limit has been reached in act 103 and if not, returns to act 101 via branch 105.

Figure 1:
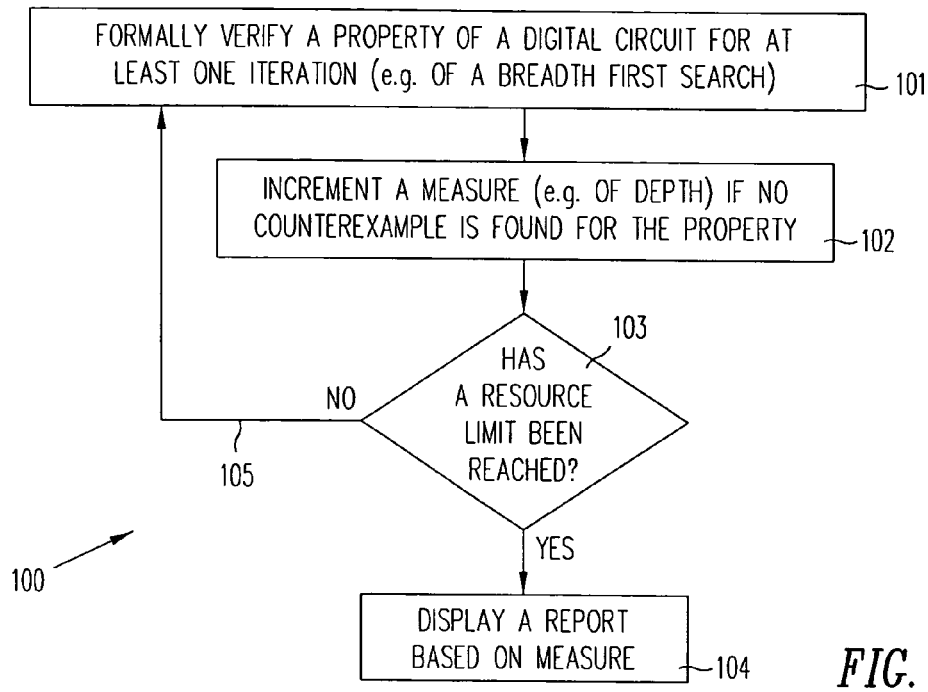
FIG. 1 illustrates, in a flow chart, one embodiment of a method for use of a formal verification tool to check a property, while maintaining a measure of the work done.

In several embodiments, at each iteration of the method, a measure (also called "proof radius") is maintained, of the analysis being performed by the tool in act 101 without finding a counter-example to the property being checked e.g. in an act 102 as shown in FIG. 1. In some embodiments of the invention, the formal verification tool is used to conduct a breadth-first search of the state space, wherein the number "n" of transitions from a current state is set to one. In other embodiment the search need not be breadth first, e.g. if the tool checks the property for n (greater than one) successive transitions from the current state. Regardless of the type of search, the depth reached by the tool (in number of sequential transitions through number of reachable states) from the initial state without finding a counter example is maintained in act 102, as a measure of the analysis that has been done. When a limit on one or more resources is reached (as determined in act 103), method 100 stops iteration and instead goes to act 104. In act 104, the method reports the measure as an indication of the amount of analysis that has been done without finding a counterexample to the property being checked.

The analysis measure being reported by method 100 (e.g. in act 104) is indicative of the amount of analysis that has been performed (e.g. the depth to which the search progressed) during formal verification, without finding a counter-example for the property being checked. Such a measure may be used as a guide for future testing, or to terminate testing, depending on the embodiment.

Figure 2A:
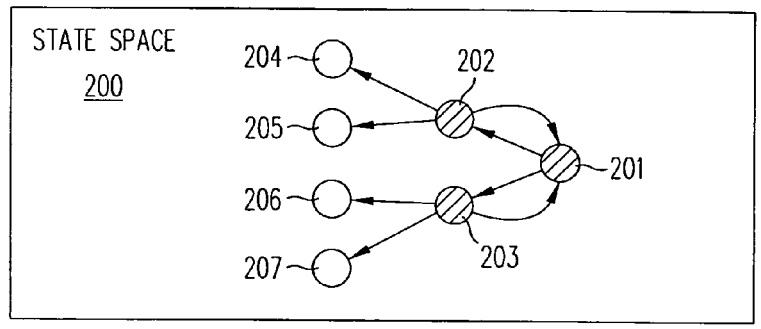
FIGS. 2A and 2C each illustrate, in a diagram of state space, the states visited by a formal verification tool in performing one and two iterations respectively, of the method of FIG. 1.

Operation of method 100 (FIG. 1) is now described in the context of an example illustrated in FIG. 2A. In this example, a state space 200 contains a number of states 201-207 that are representative of a digital circuit (based on its description in HDL). Assume that method 100 starts from an initial state 201. Initial state 201 may be selected by a user. Alternatively initial state 201 may be obtained from testbenches used in simulation (e.g. in a commercially available simulator such as VCS from Synopsys, Mountain View, Calif.).

When starting from states in a simulation testbench, method 100 uses a formal verification tool to explore orders of magnitude more of a digital circuit's state-space than traditional black-box simulation testbenches. Specifically, a formal verification tool (when used as described herein) performs analysis equivalent to simulating every possible legal sequence of inputs in the simulation cycles surrounding the test vector stimuli. By doing this, method 100 significantly increases the state coverage of the digital circuit and highlights many corner-case issues missed by simulation alone. In this manner, method 100 amplifies the user-specified simulation test stimuli, as illustrated in FIG. 4.

Figure 4:
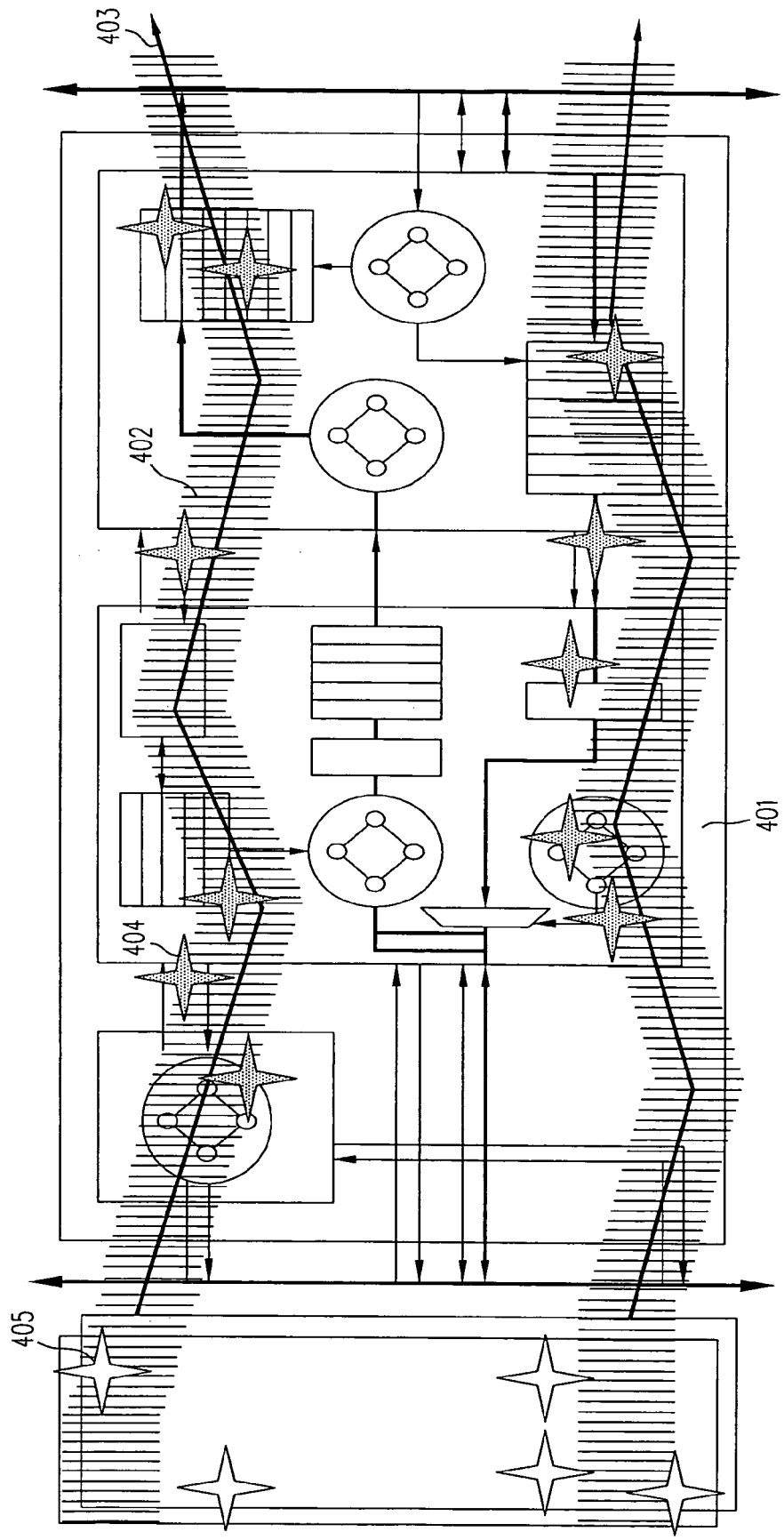
FIG. 4 illustrates, in a conceptual diagram, use of formal verification with simulation to find defects in the description of a circuit.

Referring to FIG. 4, a description of the design, 401, written in a hardware description language (e.g. Verilog) contains properties or checkers, 404, and constraints, 405. A simulation vector, 403, traverses a particular sequence of states of the design. Method 100 amplifies said simulation vector to analyze a larger set of states of the design, 402, searching for input sequences which will cause a property to be violated. Because this formal analysis is based on user-specified constraints, only legal input sequences are considered, which minimizes the number of false findings of counter examples(also called "false firings").

Figure 2B:
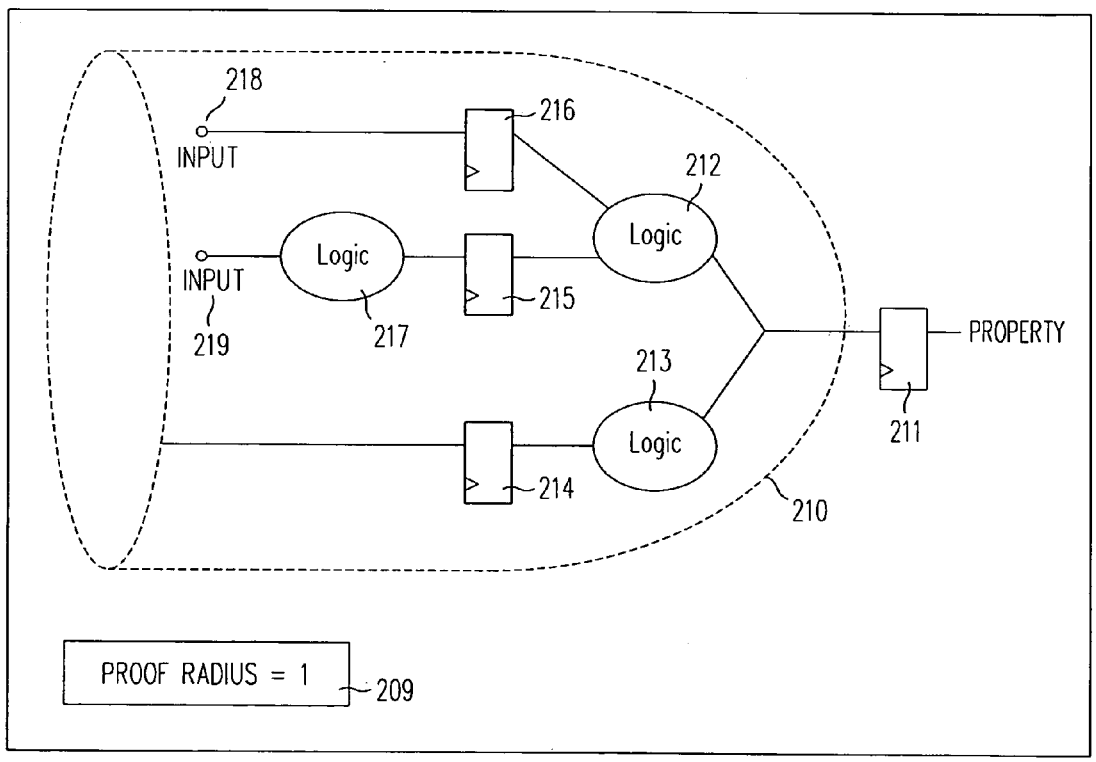
FIGS. 2B and 2D each illustrate, a logic cone representative of the property being checked when the states of FIGS. 2A and 2C respectively are visited, and a storage element indicative of the amount of work done by the formal verification tool.

Referring to the example in FIG. 2A, in performing act 101, a property that has been specified by the user is exhaustively checked (either explicitly or implicitly) in states 202 and 203 that can be reached from state 201 within a preset number n of sequential transitions (e.g. one transition) through zero or more states in the current act 101. If no counter example is found for the property, then an analysis measure 209 (FIG. 2B) is incremented (as per act 102) before returning to act 101 (via branch 105).

In one implementation, the property is not checked by simulation of each state that is one transition (i.e. n=1) away from initial state 201. Instead, a fan-in cone of logic 210 (FIG. 2B) is used to determine which inputs 218 and 219 are needed to generate an output condition that is known to be a counter-example for the property. The just-described fan-in cone of logic 210 may be determined by a transitive fanin. A transitive fanin is all the primary inputs and intermediate variables 214, 215, and 216 used by a state variable 211, wherein the state variable represents a logic element or a storage element in a circuit description.

The just-described counter-example may be determined from the property itself (by negating a Boolean expression for the property). The formal verification tool of some embodiment builds up a set of logic equations (in act 101 in FIG. 1) that represent the performance of a preset number of simulation cycles through a logic tree representative of the digital circuit being tested. By solving these equations, the tool determines whether a counter-example for a given property is reachable from states that are currently being visited (e.g. states 201-203). If a counter-example is not found, a storage element 209 (FIG. 2B) is incremented (e.g. from 0 to 1).

Therefore, in this specific implementation, the tool evaluates only states located within a register-transfer-level (RTL) logic cone 210 (FIG. 2B) that is associated with checking a property. In this manner, the tool does not verify states in the whole digital circuit description (e.g. represented by states 211-214 within the cone), thereby to simplify the task of checking the property.

Note however, that any other property checking tool can be used to perform act 101 in method 100 (FIG. 1). The just-described proof radius may be computed for a symbolic simulation tool or an explicit state enumeration tool although some embodiments (discussed herein) maintain and provide the proof radius for a tool that uses bounded model checking (BMC) to look for errors in the description of a digital circuit.

Figure 2C:
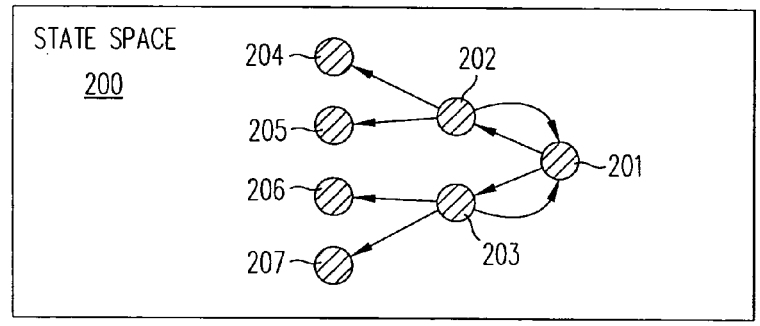
Figure 2D:
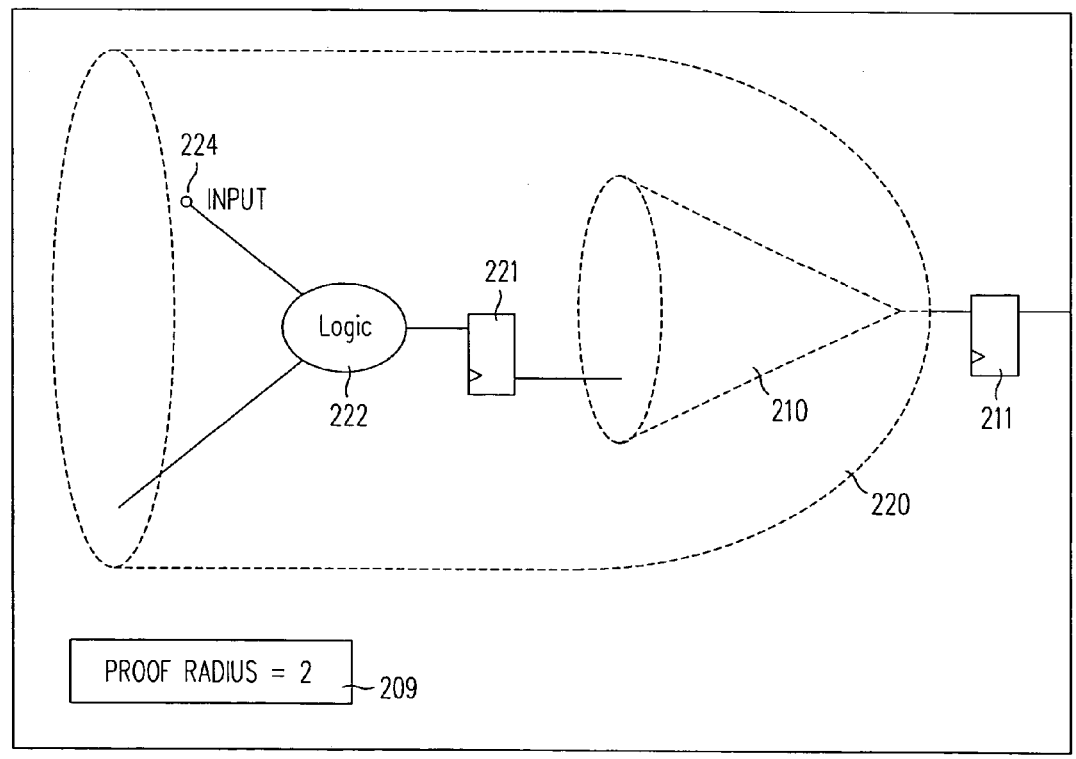
Figure 2E:
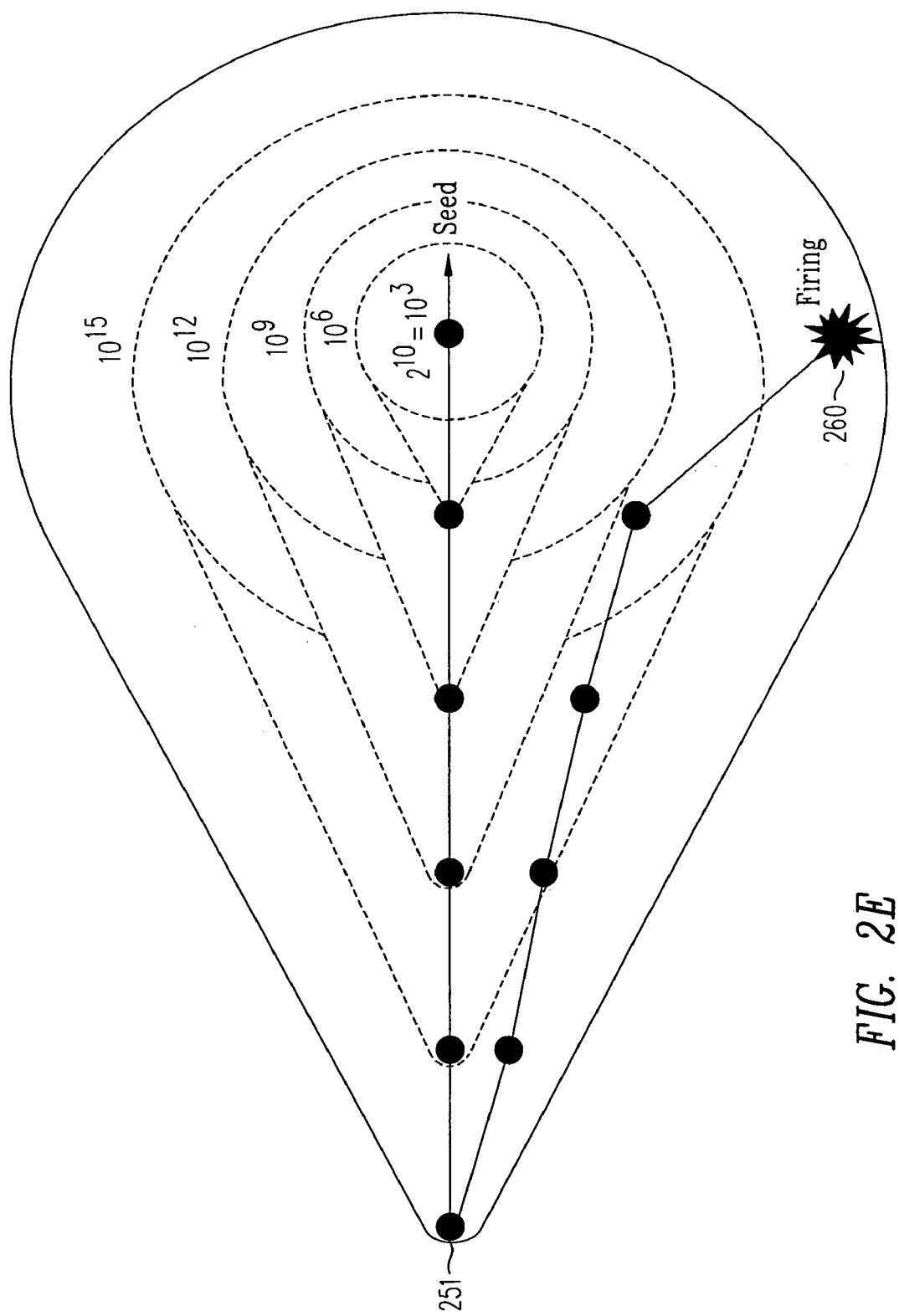
FIG. 2E illustrates, a logic cone representative of a counter-example to the property being found in a fifth iteration of the method of FIG. 1.

In a second iteration of method 100 in this example, act 101 is repeated, now by visiting states 204-207 (FIG. 2C) that are two sequential transitions away from state 201 and that are reachable from the states 202 and 203 (which were located one transition away). Once again, in actual implementation, states in a larger cone 220 (FIG. 2D) are visited, in checking whether a counter-example to the property is reachable. Again, if no counter-example is found reachable, the storage element 209 is incremented (e.g. to value 2) in act 102, and if resource limits are not yet reached, branch 105 is again taken.

In this manner, the method 100 is performed iteratively until a counter-example 260 is reached from a state 251 (which is five sequential transitions away in this example). At this stage, storage element 209 (which had been incremented in repetitively performing act 103) has the value 4. Note that if a resource limit had been reached prior to reaching state 251, then the value 4 is displayed by method 100 (as per act 104). The value 4 for the proof radius indicates that the property being checked will not be violated within 4 sequential transitions from the initial state 201. Therefore, in such embodiments, value 4 indicates that the formal verification tool has exhaustively covered every possible excursion of length 4 from the initial state 201, and formally proved that no error is possible within this distance 4. As used herein the terms "length" and "distance" are intended to mean sequential transitions from an initial state.

Figure 3:
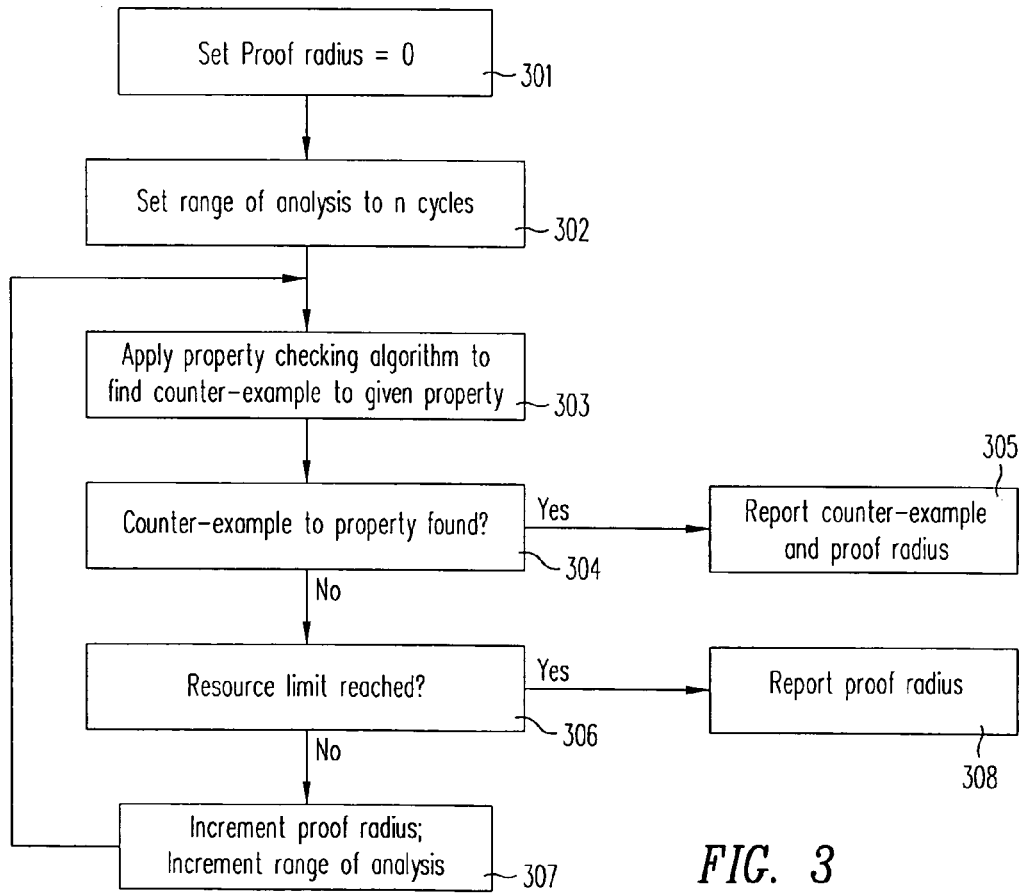
FIG. 3 illustrates, in a flow chart, one specific implementation of the method of FIG. 1.

In several embodiments, a computer is programmed to perform the following acts: starting at an initial state, set to zero a variable (also called "proof radius") that is indicative of the amount of analysis done so far (see act 301 in FIG. 3), set to one transition the range of analysis for the formal verification tool (see act 302), analyze one transition of behavior of the digital circuit to determine validity of a given property (see act 303), check if a counter-example to the property is found (see act 304) and if not found, check if a resource limit is reached (see act 306) and if not increment the proof radius and the range of analysis (see act 307), and return to act 303. When a counter example is found in act 304, report the value in the proof radius as a measure of the work done by the formal verification tool and also report the counter example (in act 305). When a resource limit is reached in act 306, the computer is programmed to report the proof radius (in act 308).

In some embodiments, if a digital circuit contains multiple clocks that operate at different frequencies, for such circuits, the proof radius is maintained in units of the greatest common divisor of all clock periods. For example if the digital circuit contains two clocks of periods 15 and 20 nanoseconds, then the greatest common divisor is 5 nanoseconds (which is not any of the original clock periods).

Although the above description refers to only checking of one property, to functionally verify a digital circuit's description (in HDL), many properties may need to be proven. Moreover, the results of a formal tool may be different for each property: e.g. a subset of the properties will be proven, another subset will have counter-examples found and a third subset will have unproven properties with a proof radius reported for each property as a measure of the analysis performed.

Therefore, to obtain better functional verification of a digital circuit description, a formal verification tool can be repetitively applied to all such properties (in act 101 in FIG. 1) before going to act 102, and when returning back via branch 105 then the tool may be applied only to subsets, of all unproven properties. In some embodiments, on returning back via branch 105, method 100 may increase the resource limits each time.

Furthermore, in some embodiments, the proof radius may be used to select a subset of the unproven properties for further analysis as follows: (1) sort list of unproven properties in ascending order of proof radius, (2) select a percentage (p %) of properties for further analysis, (3) select the properties in the top p % of the sorted list, (4) repeat analysis on selected subset of properties with higher resource limits.

As discussed above, in method 100 (FIG. 1), use of a formal verification tool needs to start from an initial state, also known as a seed state. In some embodiments, act 101 (FIG. 1) is repeatedly performed from many seed states. When method 100 is performed for a number of seed states, the proof radius of each property may be reported in three forms: (1) minimum proof radius achieved during analysis from all the seed states, (2) the average proof radius achieved during analysis from all the seed states, and (3) the maximum proof radius achieved during analysis from all the seed states. Depending on the embodiment, the report of proof radius may be given at periodic intervals during execution of the formal algorithm and/or at the end of the analysis.

In a first example, a report of the proof radii achieved for 4 properties starting from several initial states (also called "seeds") is illustrated below.

| | | Proof Radius Summary by Property | |
|---|---|---|---|
| Average | Min | Property Name | |
| 4.50 | 4 | fire cs3232_top.c0.u_MAS3232.fire | fire 0 |
| 3.50 | 3 | fire cs3232_top.c0.u_MAS3232.fire_0 | fire 0 |
| 4.20 | 3 | fire cs3232_top.c0.u_MAS3232.fire_1 | fire 0 |
| 10.50 | 6 | fire cs3232_top.c0.u_MAS3232.fire_10 | fire 0 |

In the above example, the proof radius is reported in two statistical forms over multiple states: an average and a minimum (although other statistical forms, such as a median and/or standard deviation and/or maximum may be reported in other examples). The average proof radius is obtained as a mean of the values of the proof radius for each seed, while the minimum proof radius is the smallest value across all seeds.

A large difference between the average and minimum proof radius values (as seen in the last property in the exemplary table above) may be used to increase the memory and/or computation time resources (e.g. for the last property in the table), so that eventually the difference in proof radii is more uniform across all properties. So, the proof radius can be used as a feedback, to identify one or more properties that need more effort (such additional effort is focused on the last property in the above exemplary table, while the remaining properties are not further analyzed).

In a second example, a circuit-under-verification includes a counter that increments when a primary input is asserted. A high level description (HDL) of a circuit-under-verification in the Verilog language is shown in Appendix 1 below. The property to be checked is:

count<=128

In one embodiment of method 100, the formal tool used to check the property is based on the bounded model checking (BMC) technique. Specifically, an initial state (of the circuit described in the above Verilog code) is given by the user to the formal verification tool, and in this initial state the variable "count" has been set to 0. At this time, method 100 sets the analysis measure (proof radius) to 0.

Next, at the first cycle, the BMC technique examines behavior of the counter in the Verilog code, and finding no counter-example (where the variable "in" is asserted for more than 128 total cycles), increments the proof radius to 1. This process continues until a termination condition is reached. The termination condition is one of: (1) a resource limit is reached, for example, a pre-determined computation limit, or (2) a counter-example to the property is found. At each repetition of act 101 (which corresponds to one step of the BMC technique), the proof measure is incremented.

The proof radius can also be used for comparing different formal property checking algorithms. In one embodiment, the number of seed states that can be analyzed to a fixed proof radius for a given set of properties in a given time period is measured, and compared across different algorithms. In another embodiment, the proof radius achieved for a single property in a given time period is measured, and compared.

Illustrative software source code for calculating and displaying proof radius for a number of properties in one specific example is provided in Appendix 2 below.

A computer may be programmed in the manner described herein to perform formal analysis around each state that a user simulates, with each assertion (which may be, for example, specified by the user) as a property to be checked. Moreover, in one embodiment, the user simply sets a variable (also called "effort variable") to one of three values: low, medium, and high, and the computer is programmed to automatically compute the amount of each resource to be used for each assertion for each state. For example, the computer may equally divide a total amount of compute resource usage metric (e.g. CPU time or memory) by the product (number of assertions x number of states) to arrive at a budget of that resource for each assertion in each state. Instead of compute resource usage metric, another unit, such as the number of gates or the complexity of logic may be used to divide up the limited resources, to arrive at an alternative budget for each assertion for each state.

Some embodiments compare different SAT-based BMC techniques, and in such embodiments the computer resource usage is measured in terms of the number of backtracks, where backtrack refers to a standard backtracking operation performed by prior art SAT solvers (e.g. see the above-referenced articles entitled "Algorithms for the Satisfiability (SAT) problem: A Survey", "A machine program for therorem-proving" and "Chaff: Engineering an Efficient SAT Solver").

Although in some embodiments, the computer resources are equally divided after a run is started, the user may decide to allocate more computer resources to a specific subset of states or a specific subset of assertions, e.g. by setting the effort variable to high for a given run, and to low for another run.

Numerous modifications and adaptations of the embodiments, examples, and implementations described herein will be apparent to the skilled artisan in view of the disclosure. For example, in certain embodiments of the type described above, a computer is programmed with a formal verification tool to simultaneously check a number of properties, and also maintain a proof radius for each property. A large difference in values between proof radii of different properties may be used to further test (either automatically or with manual approval) those properties that have a lower proof radius, thereby to obtain greater confidence in the overall design of the circuit.

A metric of the type described herein (e.g. the proof radius) can be used to provide a level of confidence to a user: the larger the value, the more confidence the user may have in the circuit under verification. As N tends to infinity, the user may decide that there is no bug (also called "defect") in the digital circuit if there is no counter-example. A value of N less than infinity may be used in verifying descriptions of complex real-world digital circuits, to stop testing based on practical experience. In one example, testing may be stopped when a proof radius value becomes larger than the actual or estimated diameter of the digital circuit (wherein the diameter is the minimum distance (or number of sequential transitions from an initial state) required to reach the farthest state among all possible reachable states).

A method to measure the speed of an exhaustive property checking algorithm, includes calculating a first proof radius of a first property on a first seed using a fixed budget of time, and comparing with a corresponding proof radius for another algorithm. Another method to measure the speed of an exhaustive property checking algorithm includes calculating the computation time used by said property checking algorithm to reach a pre-determined proof radius, and comparing with a corresponding computation time for another algorithm.

Moreover, a method to compare the performances of a plurality of property checking algorithms in some embodiments includes calculating the proof radius of a first property achieved by a first property checking algorithm on a first seed state, calculating the proof radius of said property achieved by a second property checking algorithm on said seed state, and comparing the first and second proof radii.

In the just described method, in some embodiments, the minimum, maximum and average proof radii of said property for a plurality of seed states are compared for different algorithms. Also in the just-described method, in several embodiments, the minimum, maximum and average proof radii of a plurality of properties are compared for said seed state. Furthermore, in some embodiments of the just-described method, the minimum, maximum and average proof radii of a property are compared for a plurality of seed states.

A metric of the type described herein can be used to benchmark different formal verification tools, e.g. by providing the same problem to multiple tools and comparing the resulting proof radii (i.e. same digital circuit, same properties and same budget yield different proof radii for the different tools due to difference in techniques being used by the two tools).

Another way to benchmark different formal verification tools is by stopping the tools when a certain proof radius is reached, when working on the same problem, and comparing the resources used by the two tools (e.g. to determine which tool finished first). One variant of this method is to determine the number of initial states that can be processed by each tool, e.g. within one second of computation time (i.e. states/second).

Numerous such modifications and adaptations of the embodiments described herein are encompassed by the attached claims.

APPENDIX 1

```
module DUV(clock, areset, in);
input clock;
input reset;
input in;
reg [31:0] count;
always @(posedge clock or posedge areset) begin
   if (areset == 1'b1) begin
      count <= 'b0;
   else
   if (in == 1'b1) begin
      count <= count + 1;
   end
end
endmodule
```

APPENDIX 2

```
/* Structure definitions */
typedef struct StatsS {
    /* chx based stats */
    int *nAborts;       /* count of seeds first abort at unroll i */
    int nNoAborts;       /* count of seeds no aborts up to max unroll */
    boolean firingLimitReached;
    /* scratch values */
    int clockPeriod;
    boolean atMaxUnroll;
    int *isAborted;     /* unroll of earliest abort (0 if no aborts) for
                           seed i cycles from cur horizon */
} SStats, *Stats;
```

APPENDIX 2-continued

```
typedef struct ctxt_struct {
    /* Context stuff */
    int         min_unroll;
    int         max_unroll;
    int         chkr_budget;      /* checker budget */
    int         n_trgtChxs;
    int         n_firedTrgtChxs;
    int         n_trgts;
    TrgtStatusS    *trgts_status;
    ChxStatsS      *trgtChxs_stats;
    int         min_budget;
    int         max_budget;
} ctxt_struct, *ctxt;
/* Code to display (and compute) proof radius */
void display_proof_radius_summary (
    ctxt scc) /* context with global data about algorithm */
{
    int i;
    bool isFound;
    chx_defn chx;
    const char *chxName;
    double aveProofRadius;
    int nTargets = 0;
    double sumOfAverages = 0;
    /* print proof radius summary */
    printf("\n");
    printf("--------------------------------------------------------------------------------\n");
    printf("Proof Radius Summary by Target\n");
    printf("--------------------------------------------------------------------------------\n");
    printf("%10s %10s      %s\n", "Average", "Minimum", "Check Name");
    printf("--------------------------------------------------------------------------------\n");
    for_all_properties(properties, i, chx) {/* For each property */
        Stats stats; /* Structure containing stats from formal analysis (BMC)*/
        get(chx, &stats); /* Get the stats structure for 1 property */
        if (!check_fired(chx)) {
            int minProofRadius = scc->max_unroll;
            int sigmaProofRadii = 0;
            int nSeeds = 0;
            int ur;
            /* aborts have proof radius of (unroll – clockPeriod). . . */
            for (ur = scc->max_unroll; ur > scc->min_unroll; --ur) {
                if (stats->nAborts[ur]) {
                    int proofRadius = ur – stats->clockPeriod;
                    nSeeds += stats->nAborts[ur];
                    sigmaProofRadii += proofRadius * stats->nAborts[ur];
                    minProofRadius = proofRadius;
                }
            }
            /* . . .except at min_unroll where the proof radius is zero */
            if (stats->nAborts[scc->min_unroll]) {
                nSeeds += stats->nAborts[scc->min_unroll];
                minProofRadius = 0;
            }
            /* seeds with no aborts have proof radius of max unroll */
            nSeeds += stats->nNoAborts;
            sigmaProofRadii += scc->max_unroll * stats->nNoAborts;
            /* check if there is a seed not yet counted */
            if (stats->atMaxUnroll && !stats->isAborted[scc->max_unroll]) {
                ++nSeeds;
                sigmaProofRadii += scc->max_unroll;
            }
            chxName = get_name(chx);
            aveProofRadius =
                (nSeeds) ? DIV(sigmaProofRadii, nSeeds) : minProofRadius;
            printf("%10.2f %10d    %s\n",
                    aveProofRadius,
                    minProofRadius,
                    chxName);
            sumOfAverages += aveProofRadius;
            nTargets++;
        }
    } end_for;
}
/* Code to find search for counter-examples to properties and
    keep track of information for proof radius calculation */
static void search_targets (
    ctxt    scc,
    int         unrollLimit,
    state_id    *Sids)
```

APPENDIX 2-continued

```
{
    int unroll, i;
    /* update stats */
    for (i=0; i<scc->n_trgtChxs; ++i) {
        Stats cs = &scc->trgtChxs_stats[i];
        if (cs->atMaxUnroll && !cs->isAborted[scc->max_unroll]) {
            ++cs->nNoAborts;
        }
        for (unroll = scc->max_unroll-1; unroll >= scc->min_unroll; --unroll) {
            cs->isAborted[unroll+1] = cs->isAborted[unroll];
        }
        cs->isAborted[scc->min_unroll] = 0;
        cs->atMaxUnroll = FALSE;
    }
    /* search for firings */
    for (unroll = unrollLimit; unroll >= scc->min_unroll; --unroll) {
        unsigned phase;
        state_id Sid = Sids[unroll];
        /* for each target. . . */
        for (i=0; i<scc->n_trgts; ++i) {
            TrgtStatusSP ts = &scc->trgts_status[i];
            /* is target not max-ed out on firings? */
            if (!ts->stats->firingLimitReached) {
                /* is the current unroll appropriate for target? */
                ts->retry[scc->min_unroll] = TRUE;
                if (ts->retry[unroll]) {
                    ts->retry[unroll] = FALSE;
                    /* is clock phase #not# appropriate for target? */
                    if (!ts->activePhases[phase] || (unroll % ts->clockPeriod)) {
                        /* try again at higher unroll! :-) */
                        ts->retry[unroll+1] = TRUE;
                        continue;
                    }
                    /* does target already fire on the seed? */
                    if (is_fired_in_state(scc->scdb, ts->trgt, Sid)) {
                        /* do not bother trying to make it fire again */
                        continue;
                    }
                    /* else */ {
                        find_firing_result_s result = { 0 };
                        find_firing_args_s args = { 0 };
                        int baseCnstrBudget;
                        int nFirings;
                        chx_stats chxStats;
                        /* OK, search for target firing! */
                        args.unroll = unroll;
                        args.budget =
                            MIN(scc->max_budget,
                                (ts->baseBudget[unroll] +
                                 ts->bonusBudget[unroll]));
                        baseCnstrBudget = (2 * ts->baseBudget[unroll]) - scc-
>min_budget;
                        args.constraintBudget =
                            MIN(2 * scc->max_budget,
                                (baseCnstrBudget +
                                 ts->bonusCnstrBudget[unroll]));
                        /* Search for counter-example to properties by applying the BMC
technique and obtain a result in the "result" structure*/
                        find_firing(scc->fc, ts->trgt, &args, &result);
                        /* digest result */
                        switch (result.status) {
                        case ABORT:
                            /* reduce baseline budget if too many aborts */
                            if (!result.cachedResultUsed) {
                                ts->nCredits[unroll]--;
                                if (ts->nCredits[unroll] == 0) {
                                    /* reduce baseline budget */
                                    int j;
                                    for (j = unroll; j <= scc->max_unroll; ++j) {
                                        ts->nCredits[j] = scc->budgetReductionThreshold;
                                        if (ts->baseBudget[j] > scc->min_budget) {
                                            ts->baseBudget[j] -= 1;
                                        }
                                    }
                                }
                            }
                        }
                    }
                }
```

APPENDIX 2-continued

```
        /* update proof radius stats */
        if (!ts->stats->isAborted[unroll]) {
            ts->stats->isAborted[unroll] = unroll;
            ++ts->stats->nAborts[unroll];
        }
        break;
      case OK:
        /* stop searching target if it fires too often */
        chxStats = get_stats(ts->stats->chx);
        nFirings = count(chxStats->firings);
        break;
      case INCONSISTENT:
        if (unroll < scc->max_unroll) {
            /* try again at higher unroll! :-) */
            ts->retry[unroll+1] = TRUE;
        } else {
            ts->stats->atMaxUnroll = TRUE;
        }
        break;
      default:
      }
    }
  }
 }
 }
 }
}
```

The invention claimed is:

1. A method implemented in a programmed computer, the method comprising a plurality of acts, said plurality of acts comprising:

formally verifying a property of a digital circuit for at least one iteration of a formal verification method using a description of said digital circuit, said description being expressed using a hardware description language;

increasing a measure of analysis if said property remains true at the end of said iteration;

iteratively repeating the act of formally verifying and the act of increasing until use of a resource reaches a first predetermined limit or said measure reaches a second predetermined limit determining if the use of the resource reaches said first predetermined limit and if said measure reaches said second predetermined limit;

displaying a report based on said measure; and setting said measure to an initial value prior to formal verification.

2. The method of claim 1, wherein said hardware description language is Verilog.

3. The method of claim 1, wherein said hardware description language is VHDL.

4. The method of claim 1, wherein said property is at least partially specified by the user.

5. The method of claim 1, wherein said description includes a plurality of properties.

6. The method of claim 5, further comprising using said measure to identify a property for further analysis.

7. The method of claim 1, wherein said description includes at least one checker.

8. The method of claim 7, wherein said checker is at least partially specified by the user.

9. The method of claim 1, wherein said description includes a plurality of checkers.

10. The method of claim 1, wherein said description includes at least one constraint.

11. The method of claim 10, wherein said constraint is at least partially specified by the user.

12. The method of claim 1, wherein said description includes a plurality of constraints.

13. The method of claim 1, wherein said digital circuit contains at least two clock signals operating at different frequencies.

14. The method of claim 1, wherein formally verifying comprises searching for an input sequence that will cause a property to be violated.

15. The method of claim 1, wherein formally verifying comprises performing a breadth-first search.

16. The method of claim 1, further comprising using said measure as a guide for further testing.

17. The method of claim 1, further comprising using said measure as a guide for terminating testing.

18. The method of claim 1, wherein said first predetermined limit is at least partially specified by the user.

19. The method of claim 1, wherein said second predetermined limit is at least partially specified by the user.

20. The method of claim 1, wherein said initial value is zero.

21. The method of claim 1, wherein said initial value is one.

22. The method of claim 1, wherein iteratively repeating comprising iteratively repeating the act of formally verifying, the act of increasing, and the act of determining until use of said resource reaches said first predetermined limit or said measure reaches said second predetermined limit.

23. The method of claim 1, wherein said first predetermined limit is a measure of a depth of search without finding a counter-example.

24. The method of claim 1, wherein said second predetermined limit comprises a measure of usage of computing resources.

25. An apparatus for formally verifying a property of a digital circuit, the apparatus comprising:

a processor;

a machine-readable medium including instructions executable by the processor for formally verifying a property of a digital circuit for at least one iteration of a formal verification method using a description of said digital circuit, said description being expressed using a hardware description language;

increasing a measure of analysis if said property remains true at the end of said iteration;

iteratively repeating the act of formally verifying and the act of increasing until use of a resource reaches a first predetermined limit or said measure reaches a second predetermined limit determining if the use of the resource reaches said first predetermined limit and if said measure reaches said second predetermined limit, displaying a report based on said measure; and setting said measure to an initial value prior to formal verification.

26. A machine-readable medium including instructions executable by a processor for formally verifying a property of a digital circuit, the machine-readable medium comprising:

one or more instructions for formally verifying a property of a digital circuit for at least one iteration of a formal verification method using a description of said digital circuit, said description being expressed using a hardware description language;

one or more instructions for increasing a measure of analysis if said property remains true at the end of said iteration;

one or more instructions for iteratively repeating the act of formally verifying and the act of increasing until use of a resource reaches a first predetermined limit or said measure reaches a second predetermined limit one or more instructions for determining if the use of the resource reaches said first predetermined limit and if said measure reaches said second predetermined limit;

one or more instructions for displaying a report based on said measure; and one or more instructions for setting said measure to an initial value prior to formal verification.

* * * * *